United States Patent
Yokokawa et al.

(10) Patent No.: US 6,284,629 B1
(45) Date of Patent: Sep. 4, 2001

(54) METHOD OF FABRICATING AN SOI WAFER AND SOI WAFER FABRICATED BY THE METHOD

(75) Inventors: Isao Yokokawa; Naoto Tate; Kiyoshi Mitani, all of Gunma-ken (JP)

(73) Assignee: Shin-Etsu Handotai Co., Ltd., Tokyo (JP)

(*) Notice: Subject to any disclaimer, the term of this patent is extended or adjusted under 35 U.S.C. 154(b) by 0 days.

(21) Appl. No.: 09/343,074

(22) Filed: Jun. 29, 1999

(30) Foreign Application Priority Data

Jul. 7, 1998 (JP) .................................. 10-208710

(51) Int. Cl.[7] .......................... H01L 21/30; H01L 21/46; B32B 4/00
(52) U.S. Cl. .......................... 438/459; 438/481; 438/977; 156/344
(58) Field of Search .................... 438/455, 456, 438/457, 458, 459; 156/344, 584

(56) References Cited

U.S. PATENT DOCUMENTS

| | | | |
|---|---|---|---|
| 4,983,251 | * 1/1991 | Haisma et al. | 156/630 |
| 5,659,192 | * 8/1997 | Sarma et al. | 257/347 |
| 5,918,139 | * 6/1999 | Mitani et al. | 438/459 |
| 5,966,620 | * 10/1999 | Sakaguchi et al. | 438/455 |
| 5,989,981 | * 11/1999 | Nakashima et al. | 438/459 |
| 6,146,979 | * 11/2000 | Henley et al. | 438/458 |
| 6,204,151 | * 3/2001 | Malik et al. | 438/460 |

FOREIGN PATENT DOCUMENTS

| | | |
|---|---|---|
| 197 53 494 | * 10/1998 | (DE) . |
| 0 528 229 A2 | * 2/1993 | (EP) . |
| 0 553 852 A2 | * 8/1993 | (EP) . |
| 0 767 486 A2 | * 9/1997 | (EP) . |
| 5-160074 | 6/1993 | (JP) ........................ H01L/21/302 |
| 5-211128 | 8/1993 | (JP) ........................ H01L/21/205 |

OTHER PUBLICATIONS

Moriceau, et al. "Hydrogen Annealing Treatment Used to Obtain High Quality SOI Surfaces,"0 XP–000830634, Proceedings 1998 IEEE International SOI Conference, Oct. 1998, p. 37–38.*

Ohkura, et al. "The Optimization of In–Situ Thermal Cleaning Focused on Surface Microroughness for Future Si Epitaxial Growth," XP–002035569, 1991, Int'l Conf. on Solid State Devices and Materials, Yokohama, pp 559–561.*

Auberton–Hervé, et al. "Smart–Cut®: The Basic Fabrication Process for UNIBOND® SOI Wafers," XP–000751689, IEICE Trans. Electron. vol. E80–C, No. 3, Mar. 1997, pp. 358–363.*

* cited by examiner

*Primary Examiner*—John F. Niebling
*Assistant Examiner*—Viktor Simkovic
(74) *Attorney, Agent, or Firm*—Hogan & Hartson, LLP

(57) ABSTRACT

There is disclosed a method of fabricating an SOI wafer wherein an oxide film is formed on at least one of two single crystal silicon wafers; hydrogen ions or rare gas ions are implanted into the upper surface of one of the two silicon wafers in order to form an ion implanted layer; the ion-implanted surface is brought into close contact with the surface of the other silicon wafer via the oxide film; heat treatment is performed to separate a thin film from the silicon wafer with using the ion implanted layer as a delaminating plane to fabricate the SOI wafer having an SOI layer; and then an epitaxial layer is grown on the SOI layer to form a thick SOI layer. There is provided an SOI wafer which has a thick SOI layer with good thickness uniformity and good crystallinity and which is useful for a bipolar device or a power device.

11 Claims, 1 Drawing Sheet

METHOD OF FABRICATING AN SOI WAFER AND SOI WAFER FABRICATED BY THE METHOD

BACKGROUND OF THE INVENTION

1. Field of the Invention

The present invention relates to a method of increasing thickness of an SOI (silicon on insulator) layer in an SOI structure wafer obtained by a method wherein an ion-implanted wafer is bonded to another wafer and a portion of the ion-implanted wafer is delaminated to provide an SOI wafer (the technique called a hydrogen ion delamination method, or a smart-cut method), and an SOI wafer produced by the method.

2. Description of the Related Art

One of typical method for producing an SOI wafer is a so-called wafer bonding method in which two mirror-polished silicon wafers are bonded together via an oxide film without use of adhesive, then subjected to a heat treatment (generally 1000° C. to 1200° C.) to increase a bonding strength, and one of the wafers is subsequently made thin.

In the wafer bonding method, thickness of one of the two wafers which are bonded to each other is made thin with grinding or etching to some extent, and then the surface thereof is subjected to a mechanochemical polishing to be finished to have an intended thickness of the SOI layer.

The SOI wafer fabricated according to the method has an advantage that crystallinity of the SOI layer and reliability of a buried oxide layer are as high as those of general silicon wafers. However, it has a disadvantage that thickness uniformity of the SOI layer achieved in the method is limited. Namely, only the uniformity in the surface of the intended thickness±0.3 $\mu$m can be achieved even if a highly precise processing method is used. Furthermore, there exists a problem of high production cost, since only one SOI wafer can be obtained from two silicon wafers.

Recently, a new method of fabricating an SOI wafer in which an ion-implanted wafer is bonded to another wafer and the wafers are then subjected to a heat treatment to be delaminated at an ion implanted layer (the technique called a hydrogen ion delamination method, or a smart-cut method) has been proposed in Japanese Patent Application Laid-Open (kokai) No. 5-211128. In this method, an oxide film is formed on the surface of at least one of two silicon wafers; hydrogen ions or rare gas ions are implanted into one surface of one of the two silicon wafers in order to form a fine bubble layer (enclosed layer) within the wafer; the ion-implanted silicon wafer is superposed on the other silicon wafer such that the ion-implanted surface comes into close contact with the surface of the other silicon wafer via the oxide film; heat treatment at 500° C. or more is then performed to delaminate a portion of the ion-implanted wafer with using the fine bubble layer as a delaminating plane, so as to delaminate a thin film; and heat treatment at high temperature is further performed to firmly bond the wafers to each other, to thereby obtain an SOI wafer. According to the method, the SOI wafer having a thickness uniformity of ±0.01 $\mu$m or less can be fabricated relatively easily.

A so-called thick layer SOI wafer which has a SOI layer having a thickness of several microns to tens microns is very useful for a bipolar device or a power device, and further development thereof is greatly expected.

The thick layer SOI wafer has been conventionally fabricated by the above-mentioned wafer bonding method, namely, by bonding a wafer having an oxide film and a bare wafer to each other, subjecting them to a bonding heat treatment at 1100° C., and grinding and polishing them to provide a thick layer SOI wafer having a desired thickness. In the method, since the wafers are not bonded to each other in the peripheral part, it is necessary to perform an edge treatment step for removing the unbonded portion before polishing. Such a step makes the method complicate, and increases production cost. Furthermore, it is not possible to improve thickness uniformity of the SOI layer only by a polishing process, and therefore, a vapor phase etching treatment called PACE (Plasma Assisted Chemical Etching) disclosed in Japanese Patent Application Laid-Open (kokai) No. 5-160074 has been performed to make thickness uniform, and the mirror polishing has been performed to remove hazes or the like. When polishing is performed after the vapor phase etching as described above, thickness uniformity of the SOI layer may be rather deteriorated, latent flaws or a damage layer may be incorporated, and crystallinity may be lowered. Furthermore, processing cost is high also in that case.

On the other hand, the hydrogen ion delamination method are significantly advantageous in productivity and cost performance, since the edge treatment process which is essential in the above-mentioned wafer bonding method is not necessary.

However, only an SOI layer having a thickness of 2 $\mu$m at most can be produced by the method, since the thickness of the SOI layer depends on a depth of ion implantation, which depends on an acceleration voltage of an ion implanter, and only about 200 keV of acceleration voltage at most is possible in high current ion implanter generally used for mass-production, because of limitation in the apparatus.

Accordingly, in order to form a thicker SOI layer by the hydrogen ion delamination method, the high current ion implanter which can provide a higher acceleration voltage is necessary. However, when the apparatus which can provide high acceleration voltage more than 200 keV is used, it takes long time to achieve a certain amount of ion implantation and thus cost is increased, since it is difficult to obtain high current by such an apparatus. Therefore, such an apparatus has not been used in mass-production. Furthermore, as in a PACE method, there is also a problem that a process such as polishing or the like is necessary in order to improve a surface roughness on the surface of SOI after delamination.

SUMMARY OF THE INVENTION

The present invention has been accomplished to solve the above-mentioned problems, and a major object of the present invention is to provide a method of fabricating a thick layer SOI wafer having excellent thickness uniformity in high productivity and at low cost by forming a silicon film on an SOI wafer obtained by hydrogen ion delamination method.

To achieve the above mentioned object, the present invention provides a method of fabricating an SOI wafer characterized in that an oxide film is formed on at least one of two single crystal silicon wafers; hydrogen ions or rare gas ions are implanted into the upper surface of one of the two silicon wafers in order to form an ion implanted layer; the ion-implanted surface is brought into close contact with the surface of the other silicon wafer via the oxide film; heat treatment is performed to separate a thin film from the silicon wafer with using the ion implanted layer as a delaminating plane to fabricate the SOI wafer having an SOI layer; and then an epitaxial layer is grown on the SOI layer to form a thick SOI layer.

As described above, when the epitaxial layer is grown on the SOI layer without polishing delaminating plane of the SOI layer after the SOI wafer having the SOI layer is; obtained by the hydrogen ion delamination method, the thick layer SOI wafer having a good thickness uniformity can be fabricated in good yield and in high productivity. Furthermore, since the SOI wafer is exposed to hydrogen atmosphere while the temperature is increased before epitaxial growth to thereby improve surface roughness of the surface of the SOI layer, surface roughness of the thick layer SOI wafer after growth of the epitaxial layer can also be improved.

In that case, since the epitaxial layer is formed on the delaminated surface of the SOI layer that still include a damage layer caused by ion implantation in some degree, the thick layer SOI wafer having the damage layer in the SOI layer under the epitaxial layer can be fabricated. In the wafer, the damage layer can be used as a gettering site for removing impurities such as heavy metal from the device active layer.

When the SOI wafer before epitaxial growth is subjected to a heat treatment in a reducing atmosphere including hydrogen or in an atmosphere including hydrogen chloride gas, a damage layer remaining on the delaminated surface of SOI layer can be removed, so that the epitaxial layer can be grown on the delaminated surface whose surface roughness has been improved. As a result, an SOI wafer that contains very few crystal defects and has a thick SOI layer with high quality such as good thickness uniformity and surface roughness can be fabricated.

When the SOI wafer is fabricated using the silicon wafer produced by Czochralski method (CZ method), void type defects having a size of 0.1 to 0.2 $\mu$m, called COP (Crystal Originated Particle), are present in the SOI layer. Accordingly, if the thickness of the SOI layer is thinner than the size of COP, hydrogen gas used in the epitaxial growth process passes through the COP, and etches the buried oxide layer, resulting in degradation of characteristics of SOI wafer.

Accordingly, the thickness of the SOI layer of the SOI wafer before growth of the epitaxial layer is preferably 0.2 $\mu$m or more, to surely prevent the buried oxide layer from being etched during the epitaxial growth process.

The thickness of the thick SOI layer after epitaxial growth is preferably more than 2 $\mu$m.

When the thick SOI layer is formed as described above, the thick SOI layer which is quite useful for a bipolar device or a power device and has good thickness uniformity can be fabricated in high productivity and with good cost performance.

The present invention also provides an SOI wafer fabricated by the method described above.

Such an SOI wafer is excellent in thickness uniformity and electric characteristics, and therefore is quite useful for a bipolar device or a power device.

The present invention also provides a method for reusing a delaminated wafer produced as a by-product in the methods described above as a silicon wafer by reprocessing it.

According to the method, a delaminated wafer produced as a by-product in the hydrogen ion delamination method of the present invention can also be reused as a silicon wafer after being reprocessed appropriately, and as a result, yield and productivity of the SOI wafer which has a thick SOI layer with good quality can be improved, and cost reduction can be achieved.

As described above, according to the present invention, an SOI wafer having a thick SOI layer excellent in thickness uniformity, crystallinity and electric characteristics, which is useful as a bipolar device or a power device, or an SOI wafer having a gettering site in the SOI layer and having a strong resistance to heavy metal contamination can be fabricated relatively easily at low cost.

Furthermore, in the method of the present invention, neither a process for making a film thin nor a polishing process for improving surface roughness is necessary, and therefore amounts of water to be used and industrial wastes such as polishing slurry are reduced, and thus, harmful influence on environment can be prevented. Furthermore, since a process for removing the unbonded part in the periphery of the wafer is not necessary, productivity and yield are further improved, enabling drastic cost reduction. Recycle of the delaminated wafer produced as a by product as a silicon wafer may further reduce the cost.

DESCRIPTION OF THE INVENTION AND A PREFERRED EMBODIMENT

Figure 1:
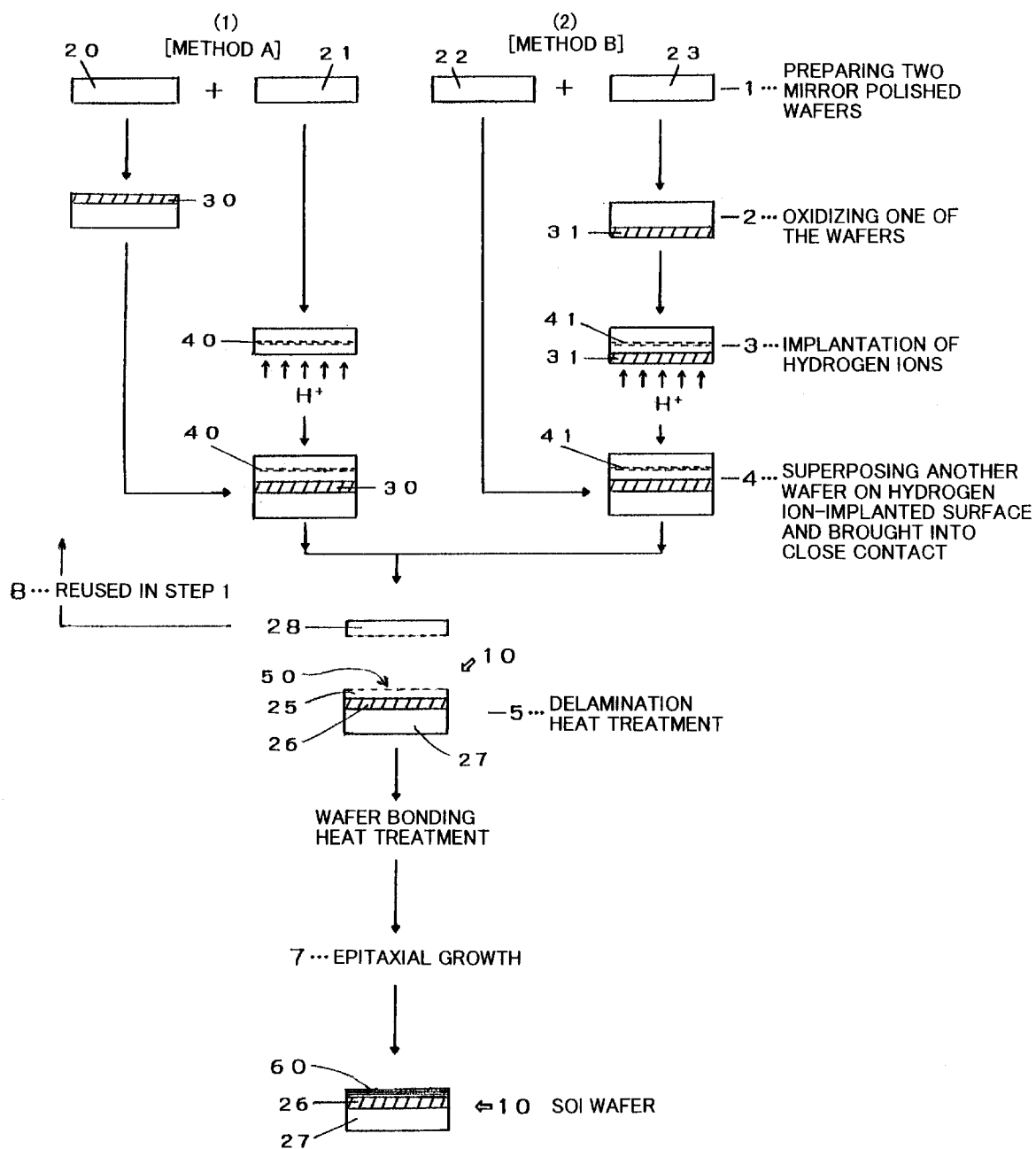
FIG. 1 is a flowchart showing an example of an SOI-wafer fabricating process of the present invention.

The present invention will be further described below in detail, referring a figure, but is not limited thereto.

FIG. 1 is a flowchart showing an example of an SOI wafer fabricating process including an epitaxial growth process, in which an ion-implanted wafer is bonded to another wafer and a portion of the ion-implanted wafer is delaminated to thereby fabricate an SOI wafer.

The hydrogen ion delamination method can be performed in two different ways, namely Method A and Method B which are different from each other in the sequence of process steps. First, a method of fabricating SOI wafer having thick film of the present invention according to Method A will be described.

In Step 1 of Method A as shown in FIG. 1 (1), two silicon mirror wafers 20, 21 which are suitable for device specifications are prepared.

In Step 2, at least one of the wafers (the wafer 20 in this case) is subjected to thermal oxidation so as to form on the surface thereof an oxide film 30 having a thickness of about 0.1 μm to 2.0 μm. In the figure, the oxide film is formed only on one surface. However, the oxide film may be formed all over the surface of the wafer 20.

In Step 3, hydrogen ions or rare gas ions are implanted into one surface of the other wafer 21, in order to form a fine bubble layer (enclosed layer) 40 which lies in parallel to the surface at a position corresponding to the mean depth of ion implantation. The implantation temperature is preferably 25–450° C.

Depth of implantation of ions depends on acceleration voltage of an ion implanter, and the thickness of SOI layer after delamination depends on the depth of implantation of ions. However, there is a limit to acceleration voltage of the ion implanter. The acceleration voltage of about 200 keV, which means thickness of about 2 μm, for example, in the case of hydrogen ion implantation, is upper limit at present.

In Step 4, the wafer 20 is superposed on the hydrogen ion-implanted surface of the hydrogen ion-implanted wafer 21 via the oxide film 30, and they are brought in close contact with each other. When the surfaces of the two wafers are brought into contact with each other at ambient temperature in a clean atmosphere, the wafers are bonded to each other without use of adhesive or the like.

In Step 5, there is performed a heat treatment for delamination in which the upper silicon (a delamination wafer) 28 is delaminated from the lower SOI wafer 10 (composed of the SOI layer 25, a buried oxide layer 26, and a base wafer 27) at the enclosed layer 40. The heat treatment is performed at a temperature of about 500° C. or higher in an inert gas atmosphere so as to cause crystal rearrangement and bubble cohesion, and thereby the delamination wafer 28 is delaminated (separated) from the lower SOI wafer. As described above, the delaminated wafer 28 is produced as a by-product in Step 5 in the present invention.

In Step 6, the wafers which have been bonded to each other in the above-mentioned Step 4, the bonding step, are subjected to heat treatment in order to improve bonding strength to a sufficient level, since the bonding strength imparted in Step 4 is too low for use in a device process. Preferably, this heat treatment is performed in an inert gas atmosphere or an oxidizing gas atmosphere at 1050–1200° C. for 30 minutes to 2 hours.

The heat treatment for delamination in Step 5 and the heat treatment for bonding in Step 6 as mentioned above may be successively performed. Alternatively, a single heat treatment serving as both of Steps 5 and 6 may be performed. The steps described above are the same as the steps of the method for fabricating an SOI wafer according to a general hydrogen ion delamination method.

In Step 7, the epitaxial layer is grown on the delaminated surface 50 which is a surface of the SOI layer 25 obtained by a hydrogen ion delamination method in order to increase a thickness of the SOI layer to a desired thickness which is more than 2 μm.

In Method A, since there is a region (non bonding portion) where an oxide film 30 (buried oxide layer 26) is exposed in the peripheral part of SOI wafer 10 after the delamination heat treatment, it is necessary to remove it in advance with an aqueous solution of hydrofluoric acid or the like before epitaxial growth. The SOI wafer 10 finally obtained after epitaxial layer growth consists of a thick SOI layer 60 having a total thickness of several microns to several tens microns, a buried oxide layer 26 and a base wafer 27.

Epitaxial growth may be performed according to CVD method as generally performed, for example, by reducing $SiCl_4$, $SiHCl_3$, $SiH_2Cl_2$, $SiH_4$ or the like with hydrogen at 1100–1200° C., to precipitate Si so that epitaxial growth may be obtained in the same crystal orientation as that of the used silicon wafer.

Alternatively, epitaxial growth can also be performed according to a molecular beam epitaxy method (MBE method) under super high vacuum ($10^{-8}$ to $10^{-11}$ Torr), at low temperature as 600 to 900° C.

The sequence of the above-mentioned steps, namely the Steps 5–6–7 may be changed to the Steps 5–7–6.

The bonding heat treatment of Step 6 and epitaxial growth of Step 7 can also be performed successively, or the treatment serving as both of Step 6 and Step 7 can also be performed.

For example, a general epitaxial growing process comprises providing a reactant gas to deposit a epitaxial layer after increasing temperature to 1000 to 1200° C. in 100% hydrogen atmosphere. Even only the above-mentioned process can improve bonding strength with epitaxial growth. Alternatively, a damage layer on the surface of the SOI is etched by being kept in an atmosphere of hydrogen or a mixed atmosphere of hydrogen chloride gas and hydrogen for a predetermined period after increasing the temperature around a reaction temperature, and then the deposition of the epitaxial layer can be successively performed. In that case, bonding strength can also be improved as a result.

Step 6 and Step 7 can be performed successively or at the same time in the same epitaxial apparatus in the above method, and thus the method is very advantageous in productivity and cost performance.

As described above, when epitaxial growth of silicon is performed on the delaminated surface of the SOI layer obtained by the hydrogen ion delamination method, the thick SOI layer having a total thickness of several microns to several tens microns can be obtained relatively easily, and an SOI wafer having uniform thickness, containing almost no crystal defects, and excellent in electric characteristics, or an SOI wafer having a gettering site in the SOI layer and having a resistibility to heavy metal contamination can be fabricated.

Next will be described a method of fabricating SOI wafer according to Method B. In Step 1 of Method B, there are prepared two mirror silicon wafers 22 and 23 suitable for device specifications.

In Step 2, at least one of the wafers is subjected to thermal oxidation to form on the surface thereof an oxide film 31 having a thickness of about 0.1–2.0 μm.

In Step 3, hydrogen ions or rare gas ions are implanted into the oxide film 31 of the wafer 23 in order to form a fine bubble layer (enclosed layer) 41 which lies in parallel to the surface at a position corresponding to the mean depth of ion implantation. The implantation temperature is preferably 25–450° C.

In Step 4, the silicon wafer 22 is superposed on the surface of the oxide film 31, which is the surface to which hydrogen ions have been implanted, of the ion-implanted wafer 23. When the surface of the two wafers are brought into contact with each other at ambient temperature in a clean atmosphere, the wafers are bonded to each other without use of adhesive or the like.

Subsequently, in Steps 5 to 7, the same treatment processes as those in Method A are performed, to thereby obtain an SOI wafer which has a thick SOI layer having uniform thickness without crystal defects.

Step 8 in this method is a step for reusing a delaminated wafer. In this step, the delaminated wafer 28 produced as a by-product in the Step 5, which is a step of the heat treatment for delamination, is reused as a silicon wafer. The wafers produced as a by-product in either Method A or Method B can be reused.

The step for reusing is designed suitably depending on the quality of the delaminated wafer. For example, when a step due to an unbonded portion and an oxide film or a damage layer remains in the peripheral part of the delaminated wafer, the reusing step includes a polishing process for polishing the delaminated surface.

The heat treatment in a reducing atmosphere including hydrogen can also be performed to remove the damage layer on the surface and improve the surface roughness.

EXAMPLES

The following examples are being submitted to further explain the present invention. These examples are not intended to limit the scope of the present invention.

Example 1

Two CZ silicon mirror wafers of conductive type p having a resistivity of 10 Ω·cm, a diameter of 150 mm and crystal axis of <100> were prepared. These wafers were processed through Steps 1 to 8 of Method B shown in FIG. 1 to thereby obtain SOI wafers according to the hydrogen ion delamination method, which have an SOI layer having a thickness of 0.5 $\mu$m, and then an epitaxial layer is grown by CVD meth of to produce SOI wafers which have a thick SOI layer having a total thickness of 2.0 $\mu$m.

The major process conditions for fabricating SOI wafers were as follows.

a) Thickness of the oxide film in Step 2: 80 nm;
b) Condition of hydrogen implantation in Step 3: $H^+$ ions, implantation energy: 67 keV, implantation dose: $8 \times 10^{16}/cm^2$;
c) Conditions of heat treatment for delamination in Step 5: in a $N_2$ gas atmosphere, at 500° C. for 30 minutes;
d) Bonding heat treatment of Step 6: none (Step 7 serves also as it);
e) Conditions of epitaxial growth by CVD method in Step 7: $H_2$ bake ($H_2$ atmosphere, 1110° C., 60 seconds), epitaxial layer deposition ($SiHCl_3+H_2$, 1110° C., 60 seconds).

An SOI layer having a thickness of 0.5 $\mu$m was formed according to the hydrogen ion delamination method in Step 5, and a thick SOI layer having a total thickness of 2.0 $\mu$m was formed by performing epitaxial growth of 1.5 $\mu$m according to the CVD method in Step 7.

Thickness uniformity and surface roughness of the SOI layer of the SOI wafer just delaminated after the heat treatment for delamination of Step 5 was measured. Thickness was measured by the spectral reflectance measurement at several thousands points in 2 mm pitch on the surface area other than the area within 10 mm from the periphery of the SOI wafer, and the results were indicated in RMS value (root-mean-square value). According to the results, a sigma (standard deviation) of the-thickness of the SOI layer after the delamination heat treatment was 0.6 nm, and therefore thickness uniformity (3 sigma) was ±1.8 nm. Surface roughness was measured by an atomic force microscope over a measuring area of 1 $\mu$m square, and it was expressed in the RMS value (root-mean-square roughness) as about 7.6 nm.

On the other hand, thickness distribution of the SOI layer after epitaxial growth in Step 7 was measured. A sigma (standard deviation) of the thickness was 18.4 nm, and therefore thickness uniformity (3 sigma) was ±55.4 nm. From the results, it is apparent that thickness uniformity was lowered little by the epitaxial growth, but was still quite excellent compared with the value, ±0.3 $\mu$m, of the wafer fabricated by a general wafer bonding method. Surface roughness was Rms value of about 0.29 nm and quite excellent.

The SOI wafer was divided into four pieces after the epitaxial growth, and a defect density in the depth direction of the SOI layer was measured. The four pieces of the wafer were etched with KOH aqueous solution at a etching removal of 1.5, 1.0, 0.5, 0 $\mu$m from the surface. The pieces were then subjected to the four step Secco etching method disclosed in H. Gassel et al. (J. Electrochem. Soc., 140, pp1713, 1993), and observed with a microscope to count a density of pits existing on the surface.

The defect density was $10^2/cm^2$ or less at any depth, which was equal to or less than that of a general bulk wafer, and was quite excellent.

Example 2

An SOI wafer having a total thickness of 7.0 $\mu$m was fabricated in the same manner as Example 1 except that thickness achieved by epitaxial growth was 6.5 $\mu$m and an epitaxial layer was deposited without $H_2$ bake (the heat treatment in approximately 100% hydrogen atmosphere). Surface roughness expressed in the RMS value was quite excellent as about 0.33 $\mu$m.

The SOI wafer was divided into four pieces. One of them was subjected to a general preferential etching (Secco etching) at an etching removal of 1 $\mu$m, and observed with a microscope to measure the defect density on the surface. No defect such as stacking fault was observed.

The other three of them were evaluated as for the defect density in the depth direction of the SOI layer in the same manner as Example 1 except that the etching removal with an aqueous solution of KOH was 5.0, 6.0 or 6.5 $\mu$m from the surface of each piece.

As for the two of them in which the etching removal was 5.0, 6.0 $\mu$m respectively, the defect density was $10^2/cm^2$ or less, as well as Example 1. As for the wafer in which the etching removal was 6.5 $\mu$m (etching to a position at which epitaxial layer had began to grow), the defect density was $7 \times 10^3/cm^2$. The results showed that the SOI layer under the epitaxial layer still included at damage that was generated when hydrogen ion was implanted. The damage layer can be used as a gettering site for removing impurity such as heavy metals from the device active layer.

The present invention is not limited to the above-described embodiment. The above-described embodiment is a mere example, and those having substantially the same structure as that described in the appended claims and providing the similar action and effects are all included in the scope of the present invention.

What is claimed is:

1. A method of fabricating an SOI wafer wherein an oxide film is formed on at least one of two single crystal silicon wafers; hydrogen ions or rare gas ions are implanted into the upper surface of one of the two silicon wafers in order to form an ion implanted layer; the ion-implanted surface is brought into close contact with the surface of the other silicon wafer via the oxide film; heat treatment is performed to separate a thin film from the silicon wafer with using the ion implanted layer as a delaminating plane to fabricate the SOI wafer having an SOI layer; and then an epitaxial layer is grown on the SOI layer to form a thick SOI.

2. The method of fabricating an SOI wafer according to claim 1 wherein the SOI wafer before the growth of the epitaxial layer is subjected to a heat treatment in a reducing atmosphere including hydrogen or in an atmosphere including hydrogen chloride gas.

3. The method of fabricating an SOI wafer according to claim 1 wherein the thickness of the SOI layer of the SOI wafer before growth of the epitaxial layer is 0.2 $\mu$m or more.

4. The method of fabricating an SOI wafer according to claim 2 wherein the thickness of the SOI layer of the SOI wafer before growth of the epitaxial layer is 0.2 $\mu$m or more.

5. The method of fabricating an SOI wafer according to claim 1 wherein the thickness of the thick SOI layer after the epitaxial growth is 2 $\mu$m or more.

6. The method of fabricating an SOI wafer according to claim 2 wherein the thickness of the thick SOI layer after the epitaxial growth is 2 $\mu$m or more.

7. The method of fabricating an SOI wafer according to claim 3 wherein the thickness of the thick SOI layer after the epitaxial growth is 2 $\mu$m or more.

8. A method for reusing a delaminated wafer produced as a by-product in the method according to claim 1 as a silicon wafer after reprocessing it.

9. A method for reusing a delaminated wafer produced as a by-product in the method according to claim 2 as a silicon wafer after reprocessing it.

10. A method for reusing a delaminated wafer produced as a by-product in the method according to claim 3 as a silicon wafer after reprocessing it.

11. A method for reusing a delaminated wafer produced as a by-product in the method according to claim 5 as a silicon wafer after reprocessing it.

* * * * *